Sept. 3, 1957 A. H. A. SIEBENBERG 2,805,338

FREQUENCY-MODULATION TUNING INDICATOR

Filed July 8, 1954 2 Sheets-Sheet 1

INVENTOR

ALEXANDER HANS ADOLF SIEBENBERG

BY

AGENT

INVENTOR
ALEXANDER HANS ADOLF SIEBENBERG
BY Fred M Vogel
AGENT

United States Patent Office 2,805,338

Patented Sept. 3, 1957

2,805,338

FREQUENCY-MODULATION TUNING INDICATOR

Alexander Hans Adolf Siebenberg, Hamburg-Fuhlsbuttel, Germany, assignor, by mesne assignments, to North American Philips Company, Inc., New York, N. Y., a corporation of Delaware

Application July 8, 1954, Serial No. 442,081

Claims priority, application Germany July 11, 1953

8 Claims. (Cl. 250—40)

The present invention relates to a tuning indicator system for a frequency-modulation receiver.

In United States Patent No. 2,784,316, issued March 5, 1957, to Te Gude et al., there is described a circuit arrangement for tuning indication in receivers for frequency-modulated oscillations by means of cathode-ray tuning indicator tubes comprising two relatively independent control members with the use of asymmetrical ratio-detector circuits. In such a circuit arrangement allowance is made for the fact that in modern receiving tubes it is common practice and in view of the cost of the complete receiver unavoidable to house the diode systems for the ratio detector in the envelope of another amplifying tube (for example a tube of the type EABC 80). More particularly, on account of the limited number of cap pins it is not possible to provide two diodes having independent cathodes for the ratio detector, so that symmetrical discriminator circuits cannot be used. However, the unilateral grounding of the ratio detector (asymmetrical connection) is also desirable in view of the fact that an amplification control voltage (for example, the rectified intermediate-frequency oscillation) may thus be derived from the anode of the diode having a non-grounded cathode. This amplification control-voltage is twice as large as that in a symmetrical circuit. It is thus possible to obtain a better control for the suppression of fading.

However, for the indication of tuning the asymmetrical ratio-detector circuit involves the difficulty that the low-frequency output voltage of the detector comprises not only the direct-voltage component originating from the detuning (detuning voltage), but also an amplification control-voltage component (rectified intermediate-frequency oscillation). The latter component is considerably larger than the detuning voltage (for example according to the value of the input signal up to —30 volts with respect to about 2 to 3 volts detuning voltage), so that satisfactory indication of tuning cannot be achieved without further expedients.

According to the system described in the said United States patent, the detuning voltage for the indication of tuning is fully made active due to the fact that from the control voltage derived from the ratio detector and a rectified intermediate-frequency voltage of suitable amplitude there is formed the difference (detuning voltage) which passes through zero at the desired tuning frequency and which is used for the control of the indicator tube.

A very simple arrangement is obtained and an uncomplicated tuning indicator tube may be utilized if, according to the invention, the control voltage derived from the ratio detector and the rectified intermediate-frequency voltage of opposite polarity are connected directly in series and supplied to a control electrode of the indicator tube.

When use is made of a tuning indicator tube having two amplifying systems coupled directly to the two deflection members, as described in one advantageous embodiment in the said United States patent, and the ratio-detector voltage and the rectified intermediate-frequency voltage are supplied directly to the control grids of the two amplifying systems, the difficulty is involved that the amplifier system must operate throughout the control range of the input signal corresponding to the rectified intermediate frequency voltage which may have a value between zero and —30 volts. While such operation may be ensured by the use of high anode resistances in the amplifier stages, such a solution is generally unsatisfactory because of the non-linear mutual conductance thus brought about.

Said difficulties are avoided if, in another embodiment of the invention, the rectified intermediate-frequency voltage is made active at the cathode of the tuning indicator system.

This may be ensured if the rectified intermediate-frequency voltage is supplied directly to the cathode of the tuning indicator tube. However, since this voltage commonly has a comparatively high generator resistance and cannot be loaded with the cathode current, it is necessary to interpose a direct-current amplifier which need not satisfy high requirements of accuracy.

An efficacious solution is obtained if, according to the invention, the rectified intermediate-frequency oscillation is supplied to the grid of the cathode follower which, on the side of the cathode, is supplied from an auxiliary-voltage source which is negative with respect to ground and the output circuit of which is connected to the cathode circuit of the tuning indicator tube.

It is alternatively possible for the high-frequency grounded point of the asymmetrical ratio detector to be connected to the positive terminal of a grounded auxiliary voltage source and for a point on the load resistance of the ratio detector to be connected to the grid of a cathode follower, of which the output circuit is connected to the cathode circuit of the tuning indicator tube. However, it is thus impossible to a certain extent to derive also a voltage for automatic amplification control from the ratio detector.

The cathode of the tuning indicator tube and that of the cathode follower are preferably interconnected and connected to a common cathode resistance.

A very simple solution is obtained if at least one system of the tuning indicator tube itself, preferably a deflection system or both deflection systems and/or the cathode-ray system serves as a cathode follower.

In order that the invention may be readily carried into effect, it will now be described with reference to the accompanying drawing, in which.

Figure 1:
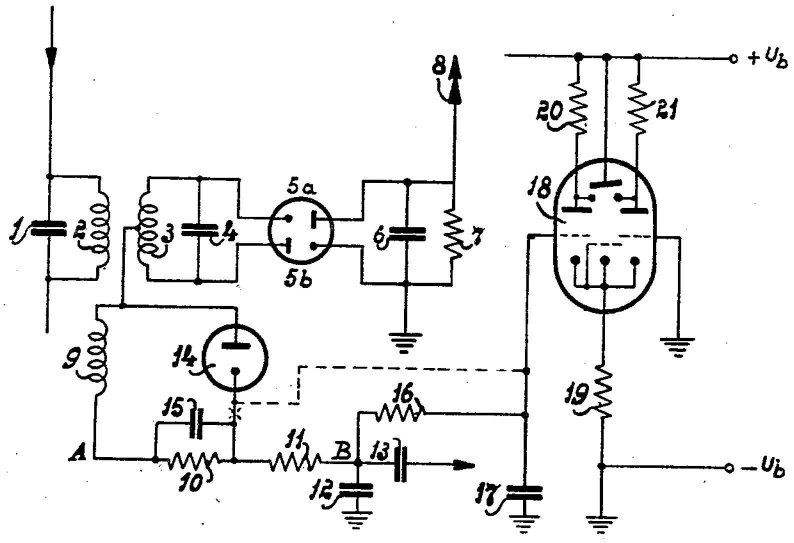
Fig. 1 is a circuit diagram of a first embodiment of the tuning indicator according to the invention, also showing a modification of said embodiment.

In Fig. 1, a current comprising the frequency modulation is supplied by the last intermediate-frequency amplifying tube to a circuit 1, 2 and transferred by way of a preferably loose coupling to a secondary oscillatory circuit 3, 4. Two diodes 5*a* and 5*b* of opposite polarities are connected to the outer connections of the oscillatory circuit 3, 4 in the manner known for asymmetrical ratio detectors, the cathode of diode 5*b* which is remote from the circuit 3, 4 being connected to ground. As a result of this connection the detector exhibits an asymmetrical characteristic, i. e. the output voltage thereof will have a finite amplitude and polarity notwithstanding the fact that the nominal frequency of the applied frequency-modulated wave coincides with the central frequency of the detector characteristic. A parallel combination of a comparatively large capacitor 6 and a load resistance 7 is provided between the anode of diode 5*a* and ground. The anode of diode 5*a* also has connected to it a lead 8 from which a suitable voltage is obtained for automatic amplification control as indicated by a double arrow.

The center of coil 3 has connected to it a coil 9 which is preferably rigidly coupled to coil 2 and the extremity of which may have derived from it in known manner via a smoothing filter 10, 11, 12 and a blocking capacitor 13 the demodulated low-frequency oscillation occurring at point B.

The voltage set up at the lower end of coil 9 (point A) comprises not only intermediate-frequency components, which can readily be removed by smoothing, and the desired low-frequency components, but also a voltage used for tuning indication and variable with detuning and an interfering direct-voltage component which is approximately equal to half the voltage existing between lead 8 and ground and variable with the intermediate-frequency oscillation. Said direct-voltage component can largely exceed the desired detuning voltage and renders direct supply of the discriminator voltage to a tuning indicator tube substantially impossible.

According to the invention, the said amplification control-voltage component is compensated due to the fact that the voltage across the coil 9 is rectified by a rectifier indicated as diode 14 and in series with the voltage on point A, is made active, via resistance 10 at a charging capacitor 15. At point B there occurs, in addition to the low-frequency oscillation, only the non-influenced detuning voltage which, after the low-frequency oscillation has been split off by a filter 16, 17, may be supplied to a control electrode of tuning indicator tube 18. The tube 18 is connected in known manner by way of a cathode resistance 19 and anode resistances 20, 21 to a voltage source $U_b$, of which the negative terminal is connected to ground. The grid of the second controllable system is grounded.

Since the controlled indicator system of tube 18, more particularly if it is a triode, has a comparatively large control range, the compensation by the counter voltage from the device 10, 14, 15 need not be very accurate; even important deviations do not prevent satisfactory results of the tuning indication. Since in this circuit arrangement the system of the indicator tube 18 shown at the right-hand side is not controlled, this system may be omitted and the relative deflection electrode or the like may be connected by way of a voltage divider to the source of supply $U_b$.

Since the load on the intermediate-frequency circuit produced by the rectifying device 10, 14, 15 must be as small as possible, use is preferably made, instead of the diode 14, of a spatially small crystal-rectifier having little capacity with respect to the surroundings. However, it is alternatively possible to utilize a diode as the rectifier, since the cathode is connected to the end of the resistance 10 which is remote from the low-frequency coil and is already capable of being bypassed for high-frequency with respect to ground by a capacitor, so that the capacity between cathode and filament is at any rate not interfering. Furthermore, the diode is in practice active as a peak rectifier and thus active for a comparatively short time only.

If the filter 10, 15 is so proportioned that its time-constant is considerably larger than the cycle of the lowest modulation frequency, the circuit 9, 10, 14, 15 which is preferably rigidly coupled to the primary coil is active as a so-called dynamic limiter and improves, more particularly when the coils 9 and 2 are coupled rigidly, the property of the ratio detector for suppressing interfering amplitude modulation.

It is alternatively possible for the cathode of diode 14 to be connected directly to the control grid of tube 18 (shown in dotted line), in which event the connection with the RC-member 10, 15 is to be interrupted. The elements 10 and 15 may then be dispensed with and by suitable proportioning of the parts 11, 12, 16, 17 and, if desired, one or more further filters, it may be ensured that hum voltages which may reach the cathode of diode 14 from the filament are kept away from the low-frequency terminal (13). However, by this method of connection the action of diode 14 as an additional dynamic limiter cannot be realized in the proper way.

Figure 2:
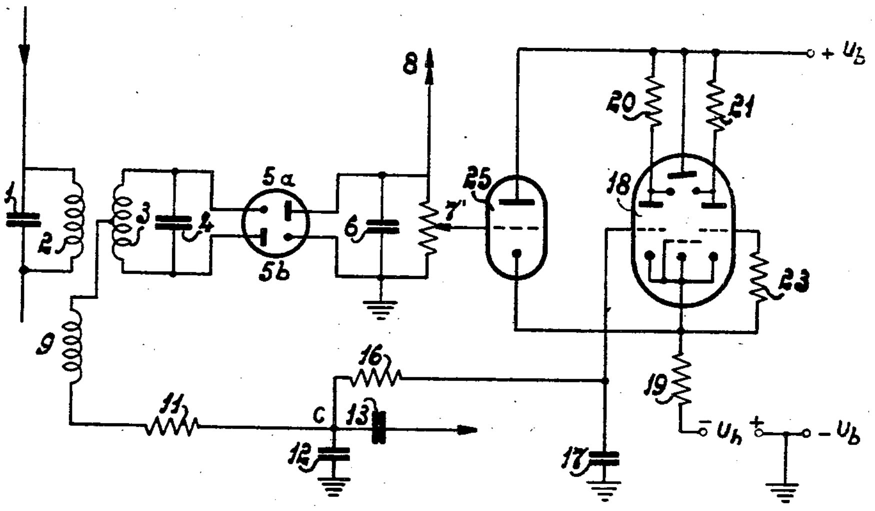
Fig. 2 is a circuit diagram of a second embodiment.

Fig. 2 shows a circuit-arrangement in which the rectified intermediate-frequency voltage is made active at the cathode of the tuning indicator tube with the use of a cathode follower.

As in Fig. 1, the parts 1, 2, 3, 4, 5*a*, 5*b*, 6 and 9 constitute a conventional ratio-detector circuit, of which the load resistance 7′ in this case is a potentiometer. The lower end of coil 9 is connected by way of an intermediate-frequency filter 11, 12 to point C, at which there occur not only the low-frequency oscillation which may be derived by way of capacitor 13, but also the desired detuning voltage, together with a direct-voltage component variable with the amplitude of the intermediate-frequency oscillation. Said voltage is supplied by way of the low-frequency filter 16, 17 to the control grid of tuning indicator tube 18.

Part of the intermediate-frequency voltage rectified by the ratio detector is derived from the sliding contact of resistor 7′ and supplied to the grid of a cathode follower 25 which, on the side of the cathode, is supplied from an auxiliary voltage source $U_h$ which is negative with respect to ground. The tube 25 is shown as a triode, but may alternatively be a tetrode or pentode or the like.

When the connection with tube 18 is disregarded for the time being, the voltage of the sliding contact on resistor 7′ is set up across the cathode resistance of tube 25 with slightly reduced value but with a considerably smaller internal resistance and hence amplified in capacity. The cathode of tube 25 and the cathode of tuning indicator tube 18 may thus be connected directly to ensure that the rectified intermediate-frequency voltage is active at the cathode of the tuning indicator tube and the control thereof is influenced substantially only by the detuning voltage supplied via point C to the left-hand control grid. The right-hand control grid of tube 18 is connected via a high resistance 23 to the cathode of the same tube and is thus maintained at approximately zero volts with respect to the cathode by a small grid current, it being possible to ensure proper adjustment of the indication by varying the value of resistor 21. Consequently, as in Fig. 1, this system is not controlled and may thus be dispensed with, if the corresponding deflection electrode or the like is connected by way of a voltage divider to the source of supply $U_b$.

If it is ensured that the cathode current of tube 25 is considerably higher than that of the tuning indicator tube 18 and if the common cathode resistance 19 is suitably proportioned and the sliding contact of resistor 7′ is adjusted higher in accordance with the amplification loss of the cathode follower 25, the rectified intermediate-frequency voltage occurring at the cathode of indicator tube 18 may have exactly the same value as that which occurs as a compensating voltage at point C. However, exact compensation is usually not required and a material decrease of the said voltage suffices to obtain satisfactory indication.

The use of a negative auxiliary voltage source is necessary, since a cathode follower with respect to the negative terminal of the battery may be controlled far to positive values of the grid voltage and the cathode voltage, but cannot be controlled far to negative values. However, the voltage derived from the rectified intermediate-frequency oscillation has negative polarity in the case under consideration more particularly on account of its connection to the control voltage for automatic volume control.

The value of the auxiliary voltage source $U_h$ which is loaded with the cathode current of the tubes 25 and 18 must preferably correspond approximately to the maximum value of the rectified intermediate-frequency voltage (when a very strong transmitter is received). The feedback resistance 19 is preferably to be proportioned such that for maximum (negative) input voltage of the grid the mutual conductance at the working point is still sufficient, for example about half the mutual conductance in the absence of grid-control voltage (no reception). A directional value of the cathode resistance results from the current control of the cathode follower permissible in view of the variation in mutual conductance within the voltage range controlled by the grid voltage.

Since, according to the invention, the rectified intermediate-frequency voltage is made active at the cathode of the tuning indicator tube, it is ensured that between the cathode and the grid to which the discriminator voltage is supplied there occurs substantially only the detuning voltage proper; but an undesired great shift of working point by the component variable with the rectified intermediate frequency is avoided.

Figure 3:
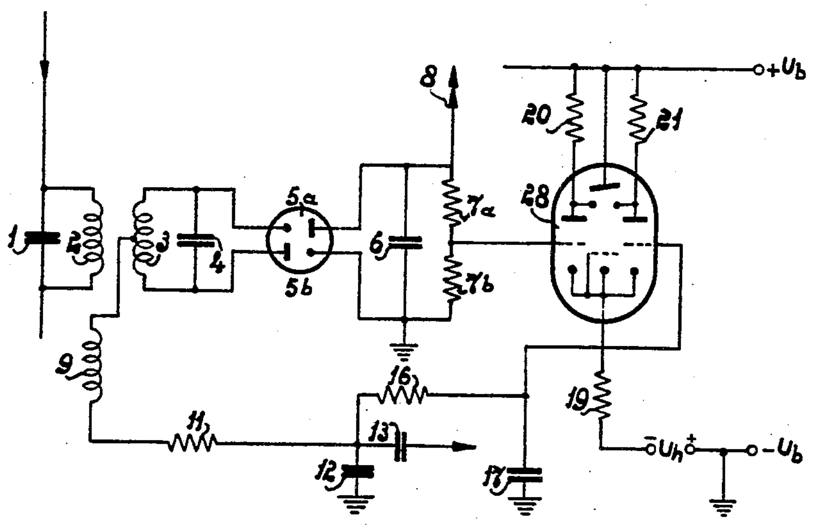
Fig. 3 is a circuit diagram of a third embodiment.

In the circuit arrangement shown in Fig. 3 the tuning indicator tube itself is active as a cathode follower.

The meaning and operation of the components 1, 2, 3, 4, 5*a*, 5*b*, 6, 9, 11, 12, 13, 16, 17, 19, 20 and 21 are similar in Fig. 3 and in Fig. 2. The tuning indicator tube 28, as the tube 18 in Fig. 2, comprises a second control grid which is connected to the center of the load resistance of the ratio detector, which resistance comprises identical parts 7*a* and 7*b*. The second control grid, together with the resistance 19, is active as a cathode follower, it being beneficial that at the first control-grid the same value of rectified intermediate-frequency voltage from the discriminator output is active as from the voltage divider 7*a*, 7*b*, so that the cathode current is equally influenced in this respect by the two control grids. The two amplifying systems are preferably similar in electrical respect. Their common cathode current must be either equal to or higher than that of the cathode-ray system. In this case, the difference between the two control-grid voltages, viz the pure detuning voltage, is active only for the indication itself.

The auxiliary voltage $U_b$ may be derived in known manner by means of a simple rectifier or a voltage-doubling circuit, if desired with the use of a voltage divider, from the mains or a transformer winding or the filament circuit. The required rectifying diode (or diodes) may alternatively be incorporated in the tuning indicator tube 18 and one of the cathodes already available may then be utilized to decrease the number of circuit elements, since the number of cap pins is limited and each electrode cannot therefore be led out individually.

While the invention has been described by means of specific examples and in specific embodiments, I do not wish to be limited thereto, for obvious modifications will occur to those skilled in the art without departing from the spirit and scope of the invention.

What is claimed is:

1. A tuning indicator system for a frequency-modulation receiver, comprising a cathode-ray indicator tube producing a cathode-ray beam and having a deflecting member, a ratio detector having an output voltage characteristic asymmetric about the central frequency thereof thereby producing an output voltage of finite value when a frequency-modulated wave having a nominal frequency equal to said central frequency is applied to said detector, an amplifier system having a cathode, a control electrode and an output electrode connected to said deflecting member, means for producing a second voltage having an intensity as determined by the intensity of said frequency-modulated wave, and means for applying said output voltage and said second voltage in series between the said cathode and control electrode of said amplifier system.

2. A tuning indicator system for a frequency-modulation receiver, comprising a cathode-ray indicator tube producing a cathode-ray beam and having a deflecting member, a ratio detector having an input resonant circuit and having an output voltage characteristic asymmetric about the central frequency thereof thereby producing an output voltage of finite value when a frequency-modulated wave having a nominal frequency equal to said central frequency is applied to said detector, an amplifier system having a cathode, a control electrode and an output electrode connected to said deflection member, means for producing a second voltage having an intensity as determined by the intensity of said frequency-modulated wave, said latter means comprising a rectifying circuit coupled to said input resonant circuit and including a charging capacitor, said rectifying circuit having a time constant longer than the period of the lowest modulation frequency impressed on said frequency-modulated wave, and means for applying said output voltage and said second voltage in series between the said cathode and control electrode of said amplifier system.

3. A tuning indicator system for a frequency-modulation receiver, comprising a cathode-ray indicator tube producing a cathode-ray beam and having a deflecting member, a ratio detector having an output voltage characteristic asymmetric about the central frequency thereof thereby producing an output voltage of finite value when a frequency-modulated wave having a nominal frequency equal to said central frequency is applied to said detector, an amplifier system having a cathode, a control electrode and an output electrode connected to said deflecting member, means for producing a second voltage having an intensity as determined by the intensity of said frequency-modulated wave, means for applying said output voltage to the control electrode of said amplifier system, and means for applying said second voltage to the cathode of said amplifier system.

4. A tuning indicator system for a frequency-modulation receiver, comprising a cathode-ray indicator tube producing a cathode-ray beam and having a deflecting member and a cathode, a ratio detector having an output voltage characteristic asymmetric about the central frequency thereof thereby producing an output voltage of finite value when a frequency-modulated wave having a nominal frequency equal to said central frequency is applied to said detector, an amplifier system having a cathode, a control electrode and an output electrode connected to said deflecting member, means for producing a second voltage having an intensity as determined by the intensity of said frequency-modulated wave, means for applying said output voltage to the control electrode of said amplifier system, and means for applying said second voltage to the cathode of said indicator tube.

5. A tuning indicator system for a frequency-modulation receiver, comprising a cathode-ray indicator tube producing a cathode-ray beam and having a deflecting member and a cathode, a ratio detector having an output voltage characteristic asymmetric about the central frequency thereof thereby producing an output voltage of finite value when a frequency-modulated wave having a nominal frequency equal to said central frequency is applied to said detector, an amplifier system having a cathode, a control electrode and an output electrode connected to said deflecting member, means for producing a second voltage having an intensity as determined by the intensity of said frequency-modulated wave, means for applying said output voltage to the control electrode of said amplifier system, means for applying said second voltage to the cathode of said indicator tube comprising a direct current amplifier tube having a cathode electrode, and means for applying a negative potential to the cathode of said indicator tube and the cathode of said direct current amplifier.

6. A tuning indicator system for a frequency-modulation receiver, comprising a cathode-ray indicator tube producing a cathode-ray beam and having a deflection member and a cathode, a ratio detector having an output voltage characteristic asymmetric about the central frequency thereof thereby producing an output voltage of finite value when a frequency-modulated wave having a nominal frequency equal to said central frequency is applied to said detector, said ratio detector comprising a load impedance element for producing a second voltage having an intensity as determined by the intensity of said frequency-modulated wave, an amplifier system having a cathode, a control electrode and an output electrode connected to said deflecting member, means for applying said output voltage to the control electrode of said amplifier system, means for applying said second voltage to the cathode of said indicator tube comprising a direct current amplifier system having a control electrode connected to said load impedance element and having a cathode connected to the cathode of said tuning indicator tube, and means for applying a negative potential to the cathode of said indicator tube and the cathode of said direct current amplifier.

7. A tuning indicator system for a frequency-modulation receiver, comprising a cathode-ray indicator tube producing a cathode-ray beam and having a deflecting member and a cathode, a ratio detector having an output voltage characteristic asymmetric about the central frequency thereof thereby producing an output voltage of finite value when a frequency-modulated wave having a nominal frequency equal to the said central frequency is applied to said detector, an amplifier system having a cathode, a control electrode and an output electrode connected to said deflecting member, means for producing a second voltage having an intensity as determined by the intensity of said frequency-modulated wave, means for applying said output voltage to the control electrode of said amplifier system, means for applying said second voltage to the cathode of said indicator tube comprising a direct current amplifier tube having a cathode electrode, and means for applying a negative potential having a value substantially equal to the peak value of said second voltage to the cathode of said indicator tube and the cathode of said direct current amplifier.

8. A tuning indicator system for a frequency-modulation receiver, comprising a cathode-ray indicator tube system producing a cathode-ray beam and comprising an envelope and within the envelope a deflecting member and a cathode, an amplifier system within said envelope and comprising a cathode connected to the cathode of said indicator tube system, an output electrode connected to said deflecting member and a control electrode, a ratio detector having an output voltage characteristic asymmetric about the central frequency thereof thereby producing an output voltage of finite value when a frequency-modulated wave having a nominal frequency equal to said central frequency is applied to said detector, means for producing a second voltage having an intensity as determined by the intensity of said frequency-modulated wave, means for applying said output voltage to said control electrode, and means comprising a direct current amplifier for applying said second voltage to the common connection of said cathodes.

References Cited in the file of this patent

UNITED STATES PATENTS

| | | |
|---|---|---|
| 2,502,293 | Vilkomerson | Mar. 28, 1950 |
| 2,514,327 | Grant | July 4, 1950 |
| 2,539,639 | Schoenfeld | Jan. 30, 1951 |